(12) United States Patent
Gonzalez Moreno

(10) Patent No.: US 9,350,315 B1
(45) Date of Patent: May 24, 2016

(54) POWER LINE COMMUNICATION FILTER FOR MULTIPLE CONDUCTORS

(71) Applicant: Marvell International Ltd., Hamilton HM (BM)

(72) Inventor: Jose Luis Gonzalez Moreno, Xirivella (ES)

(73) Assignee: MARVELL INTERNATIONAL LTD., Hamilton (BM)

(*) Notice: Subject to any disclaimer, the term of this patent is extended or adjusted under 35 U.S.C. 154(b) by 39 days.

(21) Appl. No.: 14/451,378

(22) Filed: Aug. 4, 2014

Related U.S. Application Data

(60) Provisional application No. 61/862,640, filed on Aug. 6, 2013.

(51) Int. Cl.
| | |
|---|---|
| H03H 1/00 | (2006.01) |
| H03H 7/24 | (2006.01) |
| H01F 27/28 | (2006.01) |
| H01F 27/40 | (2006.01) |
| H04B 3/56 | (2006.01) |
| H03H 7/42 | (2006.01) |

(52) U.S. Cl.
CPC ............ *H03H 1/0007* (2013.01); *H01F 27/28* (2013.01); *H01F 27/40* (2013.01); *H03H 7/24* (2013.01); *H03H 7/425* (2013.01); *H03H 7/427* (2013.01); *H04B 3/56* (2013.01); *H04B 2203/5491* (2013.01)

(58) Field of Classification Search
CPC ....... H03H 7/427; H03H 1/0007; H03H 7/24; H03H 7/425; H01F 27/28; H04B 3/56; H04B 2203/5491
USPC ............. 333/4, 5, 12, 167, 168, 181; 336/200
See application file for complete search history.

(56) References Cited

U.S. PATENT DOCUMENTS

| | | | | | |
|---|---|---|---|---|---|
| 5,179,362 | A | * | 1/1993 | Okochi | H04B 15/02 333/12 |
| 7,068,005 | B2 | * | 6/2006 | Baker | H02M 1/126 318/611 |
| 2009/0303652 | A1 | * | 12/2009 | Tallam | H02M 1/126 361/111 |
| 2011/0199751 | A1 | * | 8/2011 | Ho | H03H 7/427 361/818 |
| 2011/0293024 | A1 | * | 12/2011 | Torres Canton | H04B 3/32 375/260 |
| 2012/0300820 | A1 | * | 11/2012 | Eitel | H04B 3/54 375/222 |

* cited by examiner

*Primary Examiner* — Benny Lee
*Assistant Examiner* — Rakesh Patel

(57) ABSTRACT

An apparatus attenuates pseudo-differential signals on a plurality of conductors. The apparatus may also attenuate one or both of differential signals and common mode signals on the conductors. The signals may be Power Line Communication (PLC) signals. The apparatus includes a choke including a plurality of mutually coupled windings. The windings of the choke include a first winding and a plurality of second windings, the first winding having a number of turns equal to the sum of the number of turns of the second windings. Each of the second windings may have a substantial leakage inductance. The apparatus may further include one or more capacitors electrically coupled between windings of the choke.

19 Claims, 7 Drawing Sheets

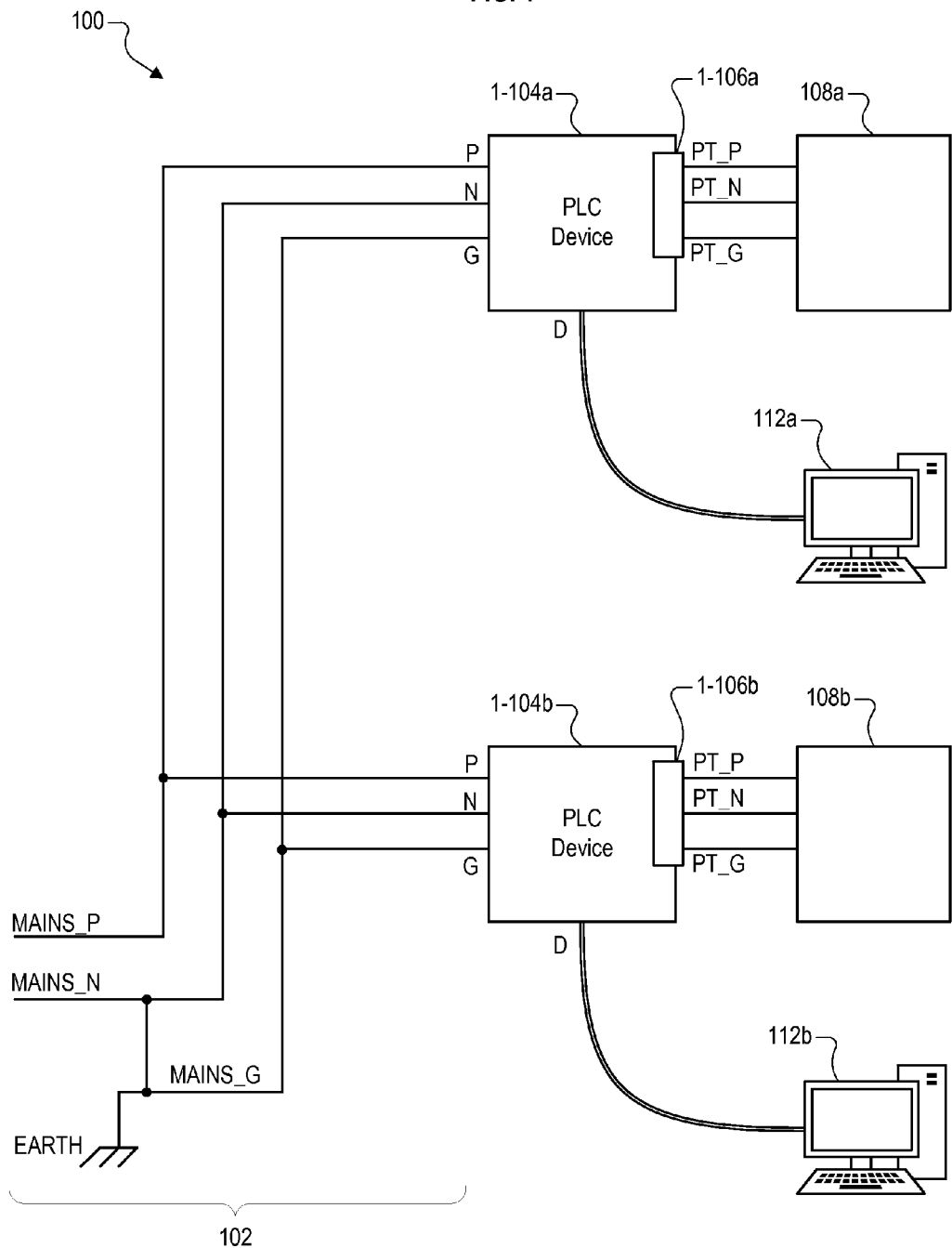

*Differential Mode*

*Common Mode*

*Pseudo-Differential Mode*

*Differential Mode + Pseudo-Differential Mode*

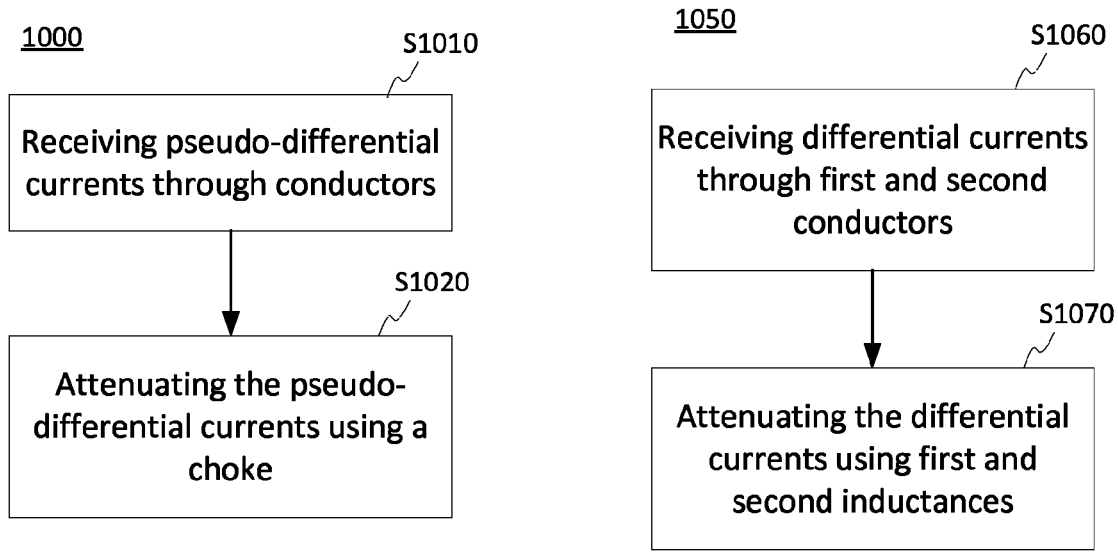

POWER LINE COMMUNICATION FILTER FOR MULTIPLE CONDUCTORS

CROSS REFERENCE TO RELATED APPLICATION

This present disclosure claims the benefit of U.S. Provisional Application No. 61/862,640, "PLC FILTER FOR MULTIPLE CONDUCTORS," filed on Aug. 6, 2013, which is incorporated by reference herein in its entirety.

BACKGROUND

Power Line Communication (PLC) uses conductors carrying electrical power, such as building wiring carrying alternating current (AC) electrical power ("mains"), to also carry data. One kind of PLC device used in a PLC network plugs into a mains socket and allows computers and other electronic devices to exchange data over the building wiring.

When the PLC device is plugged into the mains socket, the mains socket can no longer be used to supply power to other devices. Therefore, the PLC device may include one or more pass-through sockets that make the power from the mains socket available to other devices.

The PLC device may include a pass-through filter electrically connected (or electrically coupled) between the plug and the one or more pass-through sockets. The pass through filter prevents a PLC signal, such as a signal generated by a PLC modem of the PLC device, from being delivered to the devices connected to the pass-through sockets instead of to the power line connected to the mains socket. The pass-through filter may also prevent electrical noise that may be generated by a device plugged into a pass-through socket from affecting the reception of signals by the PLC modem.

SUMMARY

In an embodiment, an apparatus includes a plurality of conductors and a choke configured to attenuate pseudo-differential currents flowing in the conductors. The choke includes a plurality of mutually coupled windings.

In an embodiment, the plurality of mutually coupled windings of the choke may include a first winding and a plurality of second windings. A number of turns of the first winding is substantially equal to a total number of turns of the plurality of second windings. The plurality of conductors includes at least three conductors.

In an embodiment, the apparatus further includes first and second inductors configured to attenuate high frequency differential currents flowing in first and second conductors of the plurality of conductors, wherein the plurality of conductors includes at least three conductors. The choke may be a first choke, and the first and second inductors may be first and second mutually coupled windings of a second choke.

In an embodiment, the apparatus further includes a capacitor electrically coupled between a terminal of the first inductor and a terminal of the second inductor.

In an embodiment wherein the choke is a first choke, the apparatus further includes a second choke configured to attenuate high frequency common mode currents flowing in the conductors. The second choke may include at least three windings each having a substantially same number of turns.

In an embodiment, the apparatus further includes a first capacitor electrically coupled between a terminal of a first winding of the choke and a terminal of the second winding of the choke, and a second capacitor electrically coupled between the terminal of the second winding of the choke and a terminal of a third winding of the choke. The plurality of conductors includes at least three conductors.

In an embodiment, the choke is configured to attenuate differential currents on first and second conductors of the plurality of conductors.

In an embodiment, a first winding of the choke is electrically coupled to the first conductor, a second winding of the choke is electrically coupled to the second conductor, and the first and second windings each have a substantial leakage inductance.

In an embodiment, the apparatus further includes a capacitor electrically coupled between a terminal of the first winding and a terminal of the second winding.

In an embodiment, the leakage inductance of each of the first and second windings is at least one microhenry.

In an embodiment, the filter is electrically coupled between a Power Line Communication (PLC) modem and a pass-through socket.

In an embodiment, the attenuated pseudo-differential currents include a high frequency pseudo-differential current having a frequency above 24 KHz.

In an embodiment, the choke includes a core, a first winding wound around the core, and a plurality of second windings each wound around the core. The first winding and the plurality of second windings are mutually coupled, and a number of turns of the first winding is equal to a total number of turns of the plurality of second windings.

In an embodiment, a leakage inductance of each of the plurality of second windings is substantially greater than a leakage inductance of the first winding.

In an embodiment, a method includes receiving pseudo-differential currents through a plurality of conductors, and attenuating the pseudo-differential currents using a choke, the choke having a plurality of mutually coupled windings.

In an embodiment, the method further includes attenuating the pseudo-differential currents using first and second capacitances coupled to the choke.

In an embodiment, the method further includes receiving differential currents through first and second conductors of the plurality of conductors, and attenuating the differential currents using first and second inductances.

In an embodiment of the method, the choke is a first choke, the first inductance is a first leakage inductance of a first winding of mutually coupled windings of a second choke, and the second inductance is a second leakage inductance of a second winding of the mutually coupled windings of the second choke.

BRIEF DESCRIPTION OF THE DRAWINGS

FIG. 1 is a diagram of power line communication (PLC) network.

FIGS. 10A and 10B are flowcharts of a method of attenuating pseudo-differential currents and attenuating differential currents, respectively, according to an embodiment.

DETAILED DESCRIPTION

Figure 2A:
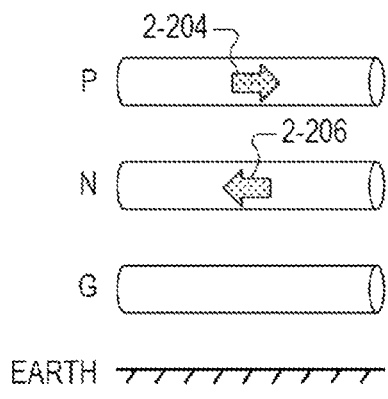
FIGS. 2A-2D show signaling modes suitable for use in a PLC network.

FIG. 1 shows a Power Line Communication (PLC) network 100. The PLC network 100 includes first and second PLC devices 1-104a and 1-104b that communicate data over an electrical power distribution system 102 including first through third conductors MAINS_P, MAINS_N and MAINS_G. The first and second conductors MAINS_P and MAINS_N may carry AC power at between 100V and 240V at a frequency of 50 Hz or 60 Hz. FIG. 1 shows single-phase electrical power distribution. In an embodiment of electrical power distribution system 102 that distributes three-phase or multi-phase power, one or more additional conductors are used to carry the additional phases.

The electrical power distribution system 102 may include one or more of a junction box, switch, socket, distribution panel, fuse, circuit breaker, surge arrestor, plug, extension cord, power cord, meter, and so on. Such devices are omitted from FIG. 1 in the interest of clarity.

The electric power is distributed using the conductor MAINS_P and MAINS_N, which are connected to a source of electric power such as a power line transformer or a generator. The conductor MAINS_G serves as a protective ground and does not normally carry electric power, instead being connected to an earth ground EARTH. The conductor MAINS_G may be connected to the conductor MAINS_N at a distribution panel or service entrance.

Each of the PLC devices 1-104a and 1-104b is electrically connected (or electrically coupled) to the electrical power distribution system 102, such as by way of plug in a plug-in PLC device or by being directly wired to the conductors of the electrical power distribution system 102 in, for example, a wall socket that includes the PLC device. In each of the PLC devices 1-104a and 1-104b, a first terminal P is electrically connected to the first conductor MAINS_P, a second terminal N is electrically connected to the second conductor MAINS_N, and a third terminal G is electrically connected to the third conductor MAINS_G.

The PLC devices 1-104a and 1-104b each include one or more pass-through sockets 1-106a and 1-106b, respectively. Each of the pass-through sockets 1-106a and 1-106b include a first pass-through terminal PT_P electrically coupled to the first terminal P, a second pass-through terminal PT_N electrically coupled to the second terminal N, and a third pass-through terminal PT_G electrically coupled to the third terminal G. The pass-through sockets 1-106a and 1-106b allow first and second electrical devices 108a and 108b, respectively, to receive electrical power from the electrical power distribution system 102.

Each of the PLC devices 1-104a and 1-104b further include data ports D that can send and receive data to first and second electronic devices 112a and 112b, respectively. The data port D may include a wired connection such as one or more of a USB port, an Ethernet port, and the like. The data port D may include a wireless connection such as one or more of a WiFi™ access point, a Bluetooth® transceiver, and the like.

Through the data ports D, the first and second electronic devices 112a and 112b may communicate with each other using the PLC devices 1-104a and 1-104b and the electrical power distribution system 102. Each of the electronic devices 112a and 112b may also receive electrical power through one of the pass-through sockets 106a and 106b.

FIGS. 2A-2D show signaling modes that may be used by the PLC devices 1-104a and 1-104b to communicate with each other and with other PLC devices connected to the electrical power distribution system 102. The signaling modes operate by injecting into the conductors of the electrical power distribution system 102 one or more currents having a frequency substantially higher (for example, 24 KHz, 100 KHz, 1 MHz, or more) than a frequency of power signals carried by the electrical power distribution system 102 (for example, 50 Hz or 60 Hz).

FIG. 2A shows an example of injecting signals using a differential mode. An injected differential current 2-204 is injected through a first conductor P, and a return differential current 2-206 returns through a second conductor N. The magnitude of the return differential current 2-206 is equal to the magnitude of the injected differential current 2-204, and the polarity of the return differential current 2-206 is opposite that of the injected differential current 2-204.

Figure 2B:
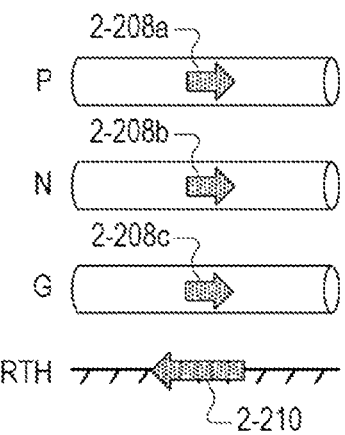

FIG. 2B shows an example of injecting signals using a common mode. First through third common mode injected currents 2-208a through 2-208c each having a same polarity are injected through first through third conductors P, N, and G, and a return common mode current 2-210 returns through a reference plane EARTH. A magnitude of the return common mode current 2-210 is equal to a sum of a magnitude of each of the injected common mode currents 2-208a through 2-208c, and a polarity of the return common mode current 2-210 is opposite that of the polarity of the injected common mode currents 2-208a through 2-208c. A person of skill in the art in light of the teachings and disclosures herein would understand that common mode signal injection may be used with any electrical power distribution system having a reference plane and one or more conductors.

Figure 2C:
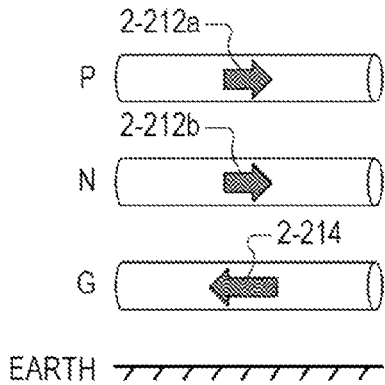

FIG. 2C shows an example of injecting signals using a pseudo-differential mode. First and second pseudo-differential injected currents 2-212a and 2-212b each having a same polarity are injected through first and second conductors P and N, and a pseudo-differential return current 2-214 returns through a third conductor G. A magnitude of the pseudo-differential return current 2-214 is equal to a sum of a magnitude of each of the pseudo-differential injected currents 2-212a and 2-212b, and a polarity of the pseudo-differential return current 2-214 is opposite that of the polarity of the pseudo-differential injected currents 2-212a and 2-212b. A person of skill in the art in light of the teachings and disclosures herein would understand that pseudo-differential signal injection may be used with any electrical power distribution system having three or more distinct conductors.

Figure 2D:
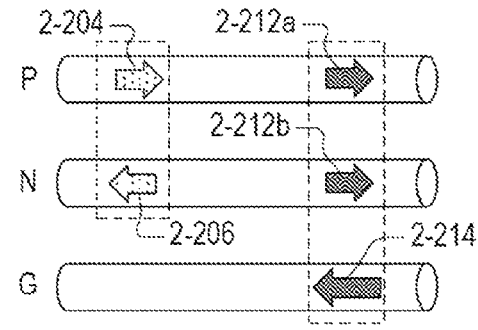

FIG. 2D shows an example of injecting signals using both a differential mode and a pseudo-differential mode simultaneously. Currents are injected and return as described with reference to FIGS. 2A and 2C, above. Other than the electric power currents, for each of first through third conductors P, N, and G, the total current flowing in that conductor is equal to the sum of the currents injected into the conductor minus any return currents in the conductor. Therefore, when the pseudo-differential injected currents 2-212a and 2-212b have equal magnitudes, the currents other than the electric power currents in each conductors are given by Equation 1:

$$I_P = I_{pdm} + I_{dm},\ I_N = I_{pdm} - I_{dm},\ \text{and}\ I_G = -2 \cdot I_{pdm} \qquad \text{Equation 1}$$

where $I_P$, $I_N$, and $I_G$ are the magnitudes of the currents in conductors P, N, and G, respectively, $I_{pdm}$ is the magnitude of each of the first and second pseudo-differential injected currents 2-212a and 2-212b, and $I_{dm}$ is the magnitude of the injected differential current 2-204. Conversely, if the currents $I_P$ and $I_N$ other than the electric power currents in the conductors are known, the injected currents may be determined using Equation 2:

$$I_{pdm}=(I_P+I_N)/2, \text{ and } I_{dm}=(I_P-I_N)/2 \qquad \text{Equation 2}$$

Figure 3:
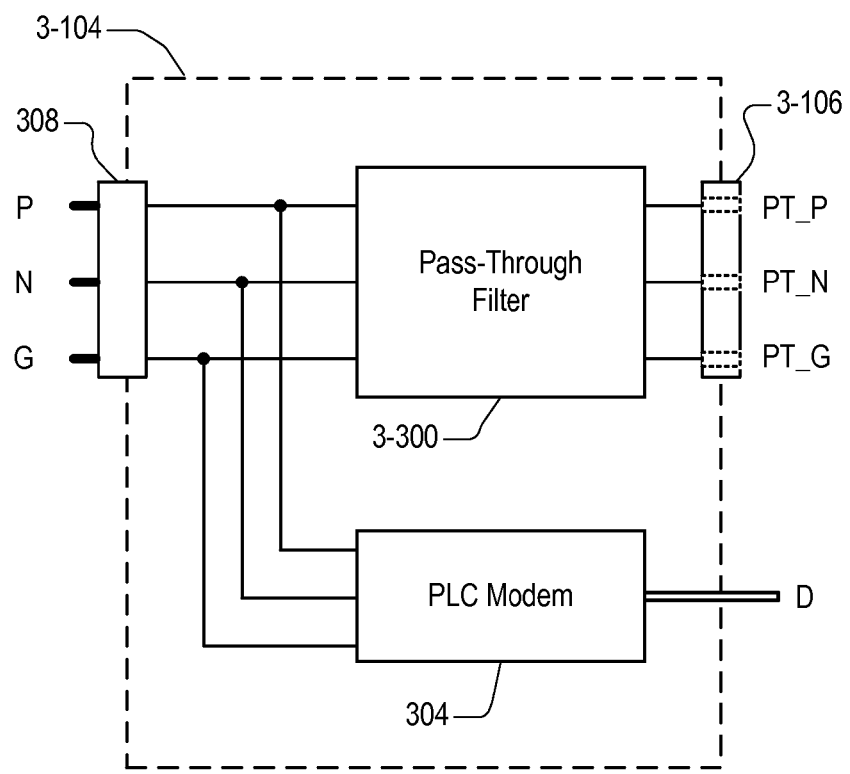
FIG. 3 is a diagram of a PLC device.

FIG. 3 shows a PLC device 3-104 suitable for use in the PLC network 100 of FIG. 1. A plug 308 including first through third electric power terminals P, N, and G is configured to electrically connect the PLC device 3-104 to an electrical power distribution system. The PLC device 3-104 includes a PLC modem 304 that injects currents through one or more of the first through third electric power terminals P, N, and G of the plug 308 according to data received on the data port D, and transmits data on the data port D based on currents sensed on one or more of the first through third electric power terminals P, N, and G.

The PLC device 3-104 includes a pass-through socket 3-106 to provide electrical power from the electrical power distribution system to other devices. First through third pass-through terminals PT_P, PT_N, and PT_G are electrically connected to first through third electric power terminals P, N, and G, respectively, using a pass-through filter 3-300.

The pass-through filter 3-300 provides a low impedance path for low frequency electrical currents (for example, direct current, 50 Hz AC current, and 60 Hz AC current) between the terminals of the plug 308 and the terminals of the pass-through socket 3-106, allowing low frequency power to be provided from the plug 308 to the pass-through socket 3-106. The pass-through filter 3-300 presents a high impedance path to high frequency electrical currents (such as currents having a frequency above 24 KHz or above 1 MHz) and is configured to attenuate the high frequency electrical currents. The pass-through filter 3-300 may attenuate the high frequency electrical currents by 20 decibels (dB) or more.

The pass-through filter 3-300 therefore attenuates high-frequency current originating at the terminals of the pass-through socket 3-106 before that high-frequency current reaches the PLC modem 304 or the plug 308. The high-frequency current originating at the terminals of the pass-through socket 3-106 may include electronic noise generated by an electrical motor, switch, dimmer, switching power supply, or other device connected to the pass-through socket 3-106.

The pass-through filter 3-300 also attenuates high-frequency current originating at the PLC modem 304 or the plug 308 before that high-frequency current reaches the pass-through socket 3-106. The high-frequency current originating at the PLC modem 304 or the plug 308 may include signals used to perform power line communications.

Figure 4:
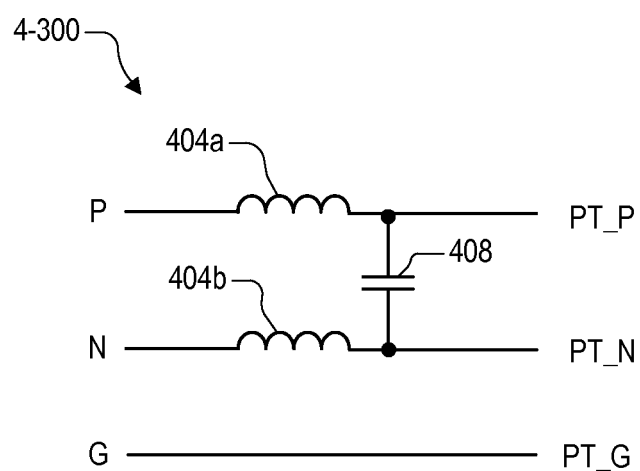
FIG. 4 is a filter circuit suitable for use in the PLC device of FIG. 3.

FIG. 4 shows a filter circuit 4-300 suitable for use in the pass-through filter 3-300 of FIG. 3. The filter circuit 4-300 includes a first inductor 404a electrically connected between a phase terminal P and a phase pass-through terminal PT_P, a second inductor 404b electrically connected between a neutral terminal N and a neutral pass-through terminal PT_N, and a capacitor 408 electrically connected between the phase pass-through terminal PT_P and the neutral pass-through terminal PT_N. A ground terminal G is electrically connected to a ground pass-through terminal PT_G. The first inductor 404a may have the same inductance as an inductance of the second inductor 404b.

The inductors 404a and 404b and the capacitor 408 are configured to operate as a low pass filter that attenuates high frequency currents flowing between the phase terminal P and phase pass-through terminal PT_P, and attenuates high frequency currents flowing between the neutral terminal N and neutral pass-through terminal PT_N. The filter circuit 4-300 is suitable for use with PLC modems that transmit data by injecting differential mode currents into two conductors of an electrical power distribution system, such as a phase P conductor and a neutral N conductor connected to the phase terminal P and the neutral terminal N, respectively.

Figure 5:
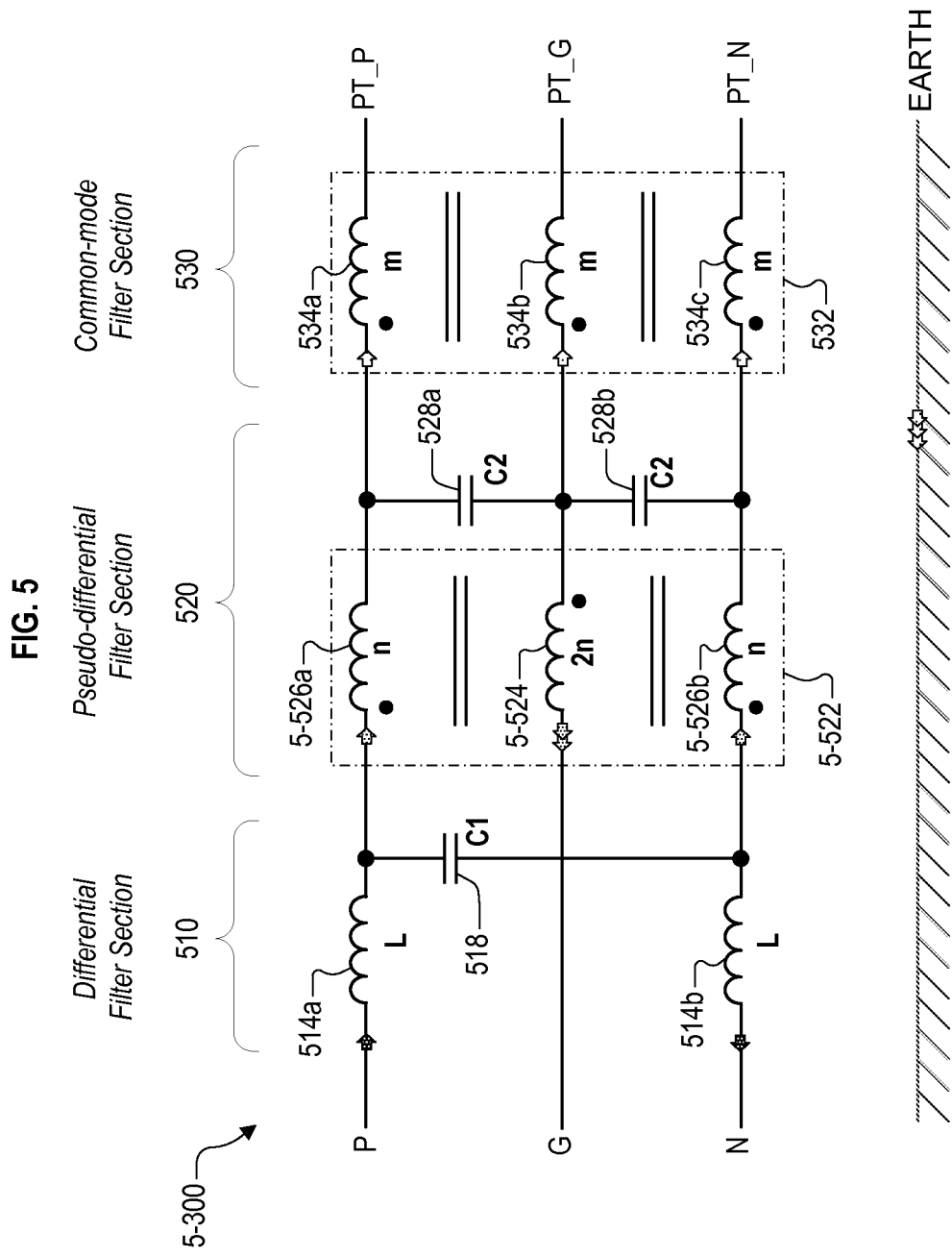
FIG. 5 is a filter circuit suitable for use in the PLC device of FIG. 3 according to an embodiment.

FIG. 5 shows a filter circuit 5-300 suitable for use in the pass-through filter 3-300 of FIG. 3 according to an embodiment. The filter 5-300 includes a differential filter section 510, a pseudo-differential section filter section 520, and a common mode filter section 530, all electrically connected in series between first through third terminals P, N, and G and first through third pass-through terminals PT_P, PT_N, and PT_G, respectively.

The filter 5-300 is suitable for use with a PLC modem that communicates using one or more or all of differential mode signals, common mode signals, and pseudo-differential mode signals. A person of skill in the art in light of the teachings and disclosures herein would understand that the filter sections 510, 520, and 530 could be connected in a different order than the order shown in FIG. 5.

The differential filter section 510 is configured to attenuate high frequency differential currents flowing between the first terminal P and the first pass-through terminal PT_P and between the second terminal N and the second pass-through terminal PT_N. The differential filter section 510 includes first and second inductors 514a and 514b and a first capacitor 518.

The first inductor 514a is electrically coupled between the first terminal P and the first pass-through terminal PT_P. The second inductor 514b is electrically coupled between the second terminal N and the second pass-through terminal PT_N. The first capacitor 518 having a capacitance value C1 is electrically coupled between a terminal of the first inductor 514a and a terminal of the second inductor 514b. In an embodiment, an inductance value L of the first inductor 514a is equal to an inductance value L of the second inductor 514b. In an embodiment, the first and second inductors 514a and 514b are mutually coupled windings of a choke.

The inductors 514a and 514b and the capacitor 518 are configured to operate as a low pass filter that attenuates high frequency currents flowing between the phase terminal P and phase pass-through terminal PT_P, and attenuates high frequency currents flowing between the neutral terminal N and neutral pass-through terminal PT_N.

The pseudo-differential filter section 520 is configured to attenuate high frequency pseudo-differential currents flowing between the first terminal P and the first pass-through terminal PT_P, between the second terminal N and the second pass-through terminal PT_N, and between the third terminal G and the third pass-through terminal PT_G. The pseudo-differential filter section 520 includes a first choke 5-522, a second capacitor 528a, and a third capacitor 528b.

The first choke 5-522 comprises three mutually coupled windings: a first winding 5-524 and second and third windings 5-526a and 5-526b. The first winding 5-524 is electrically coupled between the third terminal G and the third pass-through terminal PT_G. The second winding 5-526a is electrically coupled between the first terminal P and the first pass-through terminal PT_P. The third winding 5-526b is electrically coupled between the second terminal N and the second pass-through terminal PT_N. In an embodiment, the second winding 5-526a has a number of turns n that is the same as a number of turns n of the third winding 5-526b, and the first winding 5-524 has a number of turns 2n equal to the sum of the number of turns of the second and third windings 5-526a and 5-526b.

The second capacitor 528a is electrically coupled between a terminal of the first winding 5-524 and a terminal of the second winding 5-526a. The third capacitor 528b is electrically coupled between the terminal of the first winding 5-524 and a terminal of the third winding 5-526b. In an embodiment, the second and third capacitors 528a and 528b each have a capacitance value C2.

As indicated by the dots shown in FIG. 5 near the terminals of the first through third winding 5-524, 5-526a, and 5-526b, a first current having a first polarity flowing from the third terminal G to the third pass-through terminal PT_G generates a magnetic field in the first choke 5-522 in an opposite direction to a magnetic field generated in the first choke 5-522 by either of a second current having the first polarity flowing from the first terminal P to the first pass-through terminal PT_P or a third current having the first polarity flowing from the second terminal N to the second pass-through terminal PT_N.

For a pseudo-differential signal having a first injected current at the P terminal, a second injected current at the N terminal, and a return current at the G terminal, the magnetic fields generated in the first choke 5-522 by the currents of the pseudo-differential signal reinforce each other. As a result, the first choke 5-522 presents a high impedance to the pseudo-differential signal, thereby attenuating the pseudo-differential signal. The capacitors 528a and 528b each present a low impedance between the return current and the first and second injected currents, respectively, which further attenuates the pseudo-differential signal.

The common mode filter section 530 is configured to attenuate high frequency common mode currents flowing between the first terminal P and the first pass-through terminal PT_P, between the second terminal N and the second pass-through terminal PT_N, and between the third terminal G and the third pass-through terminal PT_G, wherein the return common mode current flows in the reference plane EARTH. The common mode filter section 520 includes a second choke 5-532.

The second choke 532 comprises three mutually coupled windings: fourth through sixth windings 534a through 534c. The fourth winding 534a is electrically coupled between the first terminal P and the first pass-through terminal PT_P. The fifth winding 534b is electrically coupled between the third terminal G and the third pass-through terminal PT_G. The sixth winding 534c is electrically coupled between the second terminal N and the second pass-through terminal PT_N. In an embodiment, the fourth through sixth windings 534a through 534c each have a same number of turns m.

As indicated by the dots shown in FIG. 5 near the terminals of the fourth through sixth windings 534a through 534c, a first current having a second polarity flowing from the third terminal G to the third pass-through terminal PT_G generates a magnetic field in the second choke 532 in the same direction as a magnetic field generated in the second choke 532 by either of a second current having the second polarity flowing from the first terminal P to the first pass-through terminal PT_P or a third current having the second polarity flowing from the second terminal N to the second pass-through terminal PT_N.

For a common mode signal having first through third injected currents at the P, N, and G terminals, respectively, the magnetic fields generated in the second choke 5-532 by the currents of the common mode signal reinforce each other. As a result, the second choke 5-532 presents a high impedance to the common mode signal that attenuates the common mode signal.

Figure 6:
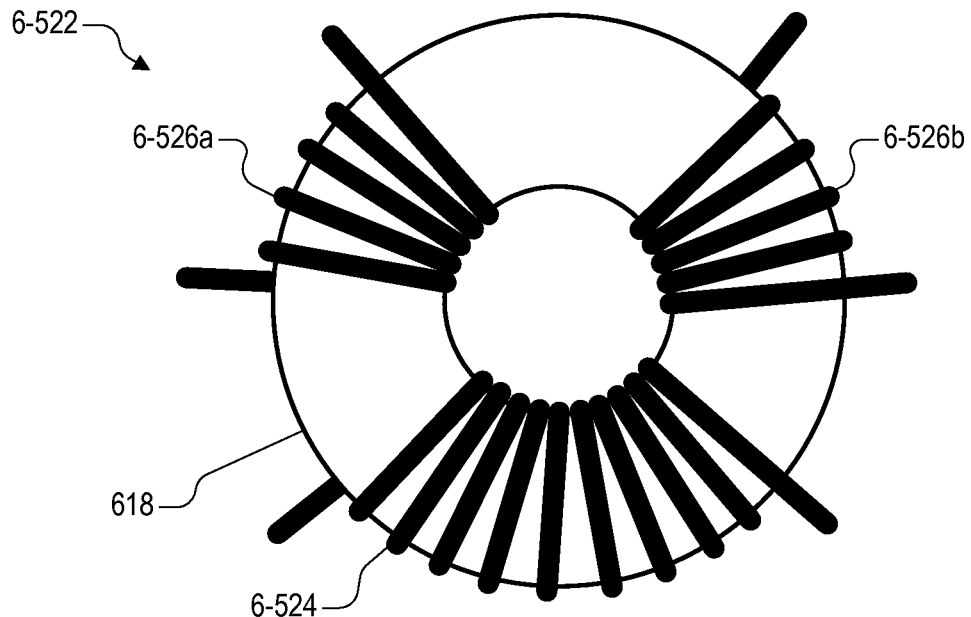
FIG. 6 is drawing of a multi-winding choke suitable for use in the filter circuit of FIG. 5 according to an embodiment.

FIG. 6 is drawing of a multi-winding choke 6-522 suitable for use as the choke 5-522 of the filter 5-300 of FIG. 5, according to an embodiment. The multi-winding choke 6-522 includes three mutually coupled windings each wound around a core 618: a first winding 6-524 and second and third windings 6-526a and 6-526b. The core 618 includes a material having a high magnetic permeability, such as ferrite, vitreous or amorphous metal, for example, Metglas® 2714A alloy, powdered carbonyl iron, laminated iron, and the like.

In this particular embodiment, the second winding 6-526a has the same number of turns as the third windings 6-526b, and the first winding 6-524 has twice as many turns as the second winding 6-526a or the third winding 6-526b. To minimize leakage inductance, each of the first through third windings 6-524, 6-526a and 6-526b are wound tightly around the core 618 and with closely spaced turns.

Leakage inductance is an inductance of a winding of a choke that results from imperfect coupling between the windings and operates in series with the mutual coupling of the windings. Imperfect coupling of the windings arises when a portion of magnetic flux generated by one or more windings does not couple to one or more of the other windings. The portion of the magnetic flux that does not couple to another winding is called leakage flux.

Figure 7:
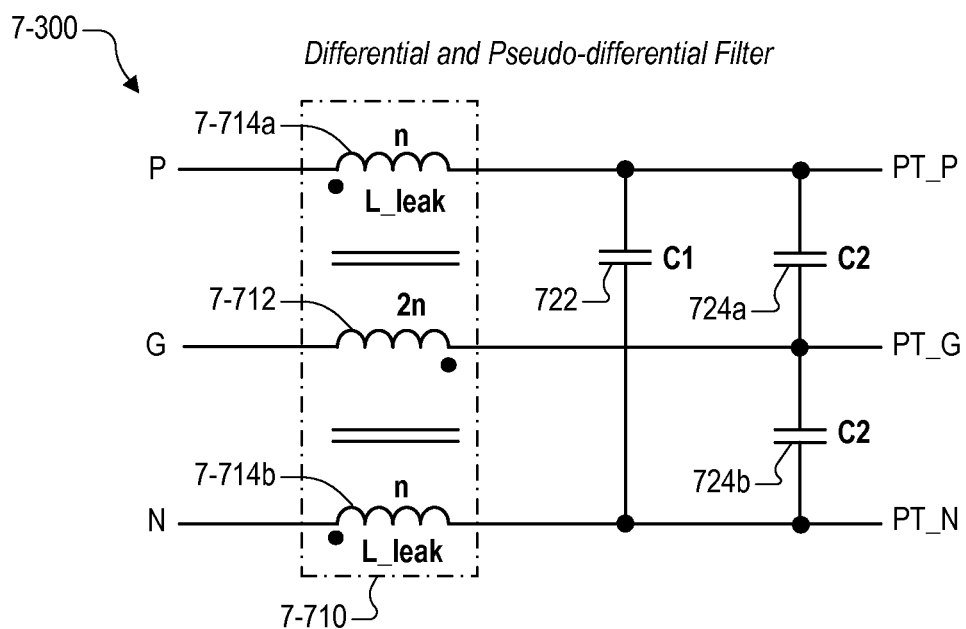
FIG. 7 is a filter circuit suitable for use in the PLC device of FIG. 3 according to another embodiment.

FIG. 7 shows a filter circuit 7-300 suitable for use as the pass-through filter 3-300 of FIG. 3 according to an embodiment. The filter circuit 7-300 is suitable for use with a PLC modem that communicates using one or both of differential mode signaling and pseudo-differential mode signaling.

The filter circuit 7-300 is configured to attenuate high frequency differential currents flowing between the first terminal P and the first pass-through terminal PT_P and between the second terminal N and the second pass-through terminal PT_N. The filter circuit 7-300 is also configured to attenuate high frequency pseudo-differential currents flowing between the first terminal P and the first pass-through terminal PT_P, between the second terminal N and the second pass-through terminal PT_N, and between the third terminal G and the third pass-through terminal PT_G.

The filter circuit 7-300 includes a choke 7-710, a first capacitor 722, and second and third capacitors 724a and 724b. The choke 7-710 includes three mutually coupled windings: a first winding 7-712 and second and third windings 7-714a and 7-714b.

The first winding 7-712 is electrically coupled between the third terminal G and the third pass-through terminal PT_G. The second winding 7-714a is electrically coupled between the first terminal P and the first pass-through terminal PT_P. The third winding 7-714b is electrically coupled between the second terminal N and the second pass-through terminal PT_N. In an embodiment, the second winding 7-714a has a number of turns n that is the same as a number of turns n of the third winding 7-714b, and the first winding 7-712 has a number of turns 2n equal to the sum of the number of turns of the second and third windings 7-714a and 7-714b.

The first capacitor 722 having a first capacitance value C1 is electrically coupled between a terminal of the second winding 7-714a and a terminal of the third winding 7-714b. The second capacitor 724a is electrically coupled between a terminal of the first winding 7-712 and a terminal of the second winding 7-714a. The third capacitor 724b is electrically coupled between the terminal of the first winding 7-712 and a terminal of the third winding 7-714b. In an embodiment, the second and third capacitors 724a and 724b each have a second capacitance value C2. In an embodiment, the first capacitance value C1 is 47 nanofarads and the second capacitance value C2 is 1 nanofarad.

As indicated by the dots shown in FIG. 7 near the terminals of the first through third winding 7-712, 7-714a, and 7-714b, a first current having a first polarity flowing from the third terminal G to the third pass-through terminal PT_G generates a magnetic field in the choke 7-710 in an opposite direction to a magnetic field generated in the choke 7-710 by either of a second current having the first polarity flowing from the first terminal P to the first pass-through terminal PT_P or a third current having the first polarity flowing from the second terminal N to the second pass-through terminal PT_N.

The first winding 7-712 of the choke 7-710 is made having minimal leakage inductance. The second and third windings 7-714a and 7-714b are made having substantial leakage inductance. In an embodiment, the second and third windings 7-714a and 7-714b each have a leakage inductance of 1 microhenries or more. In another embodiment, the second and third windings 7-714a and 7-714b each have a leakage inductance of 2 microhenries or more. In an embodiment, the second and third windings 7-714a and 7-714b each have a substantially identical leakage inductance.

The first through third windings 7-712, 7-714a and 7-714b are configured to produce, using the mutual coupling between the three windings, a first attenuation of pseudo-differential currents flowing through the filter circuit 7-300, and the second and third capacitors 724a and 724b are configured to increase the first attenuation. The second and third windings 7-714a and 7-714b are configured to produce, using their respective leakage inductance, a second attenuation of differential currents flowing through the filter circuit 7-300, and the first capacitor 722 is configured to increase the second attenuation. In an embodiment, the first and second attenuations are greater than or equal to 20 dB.

Figure 8:
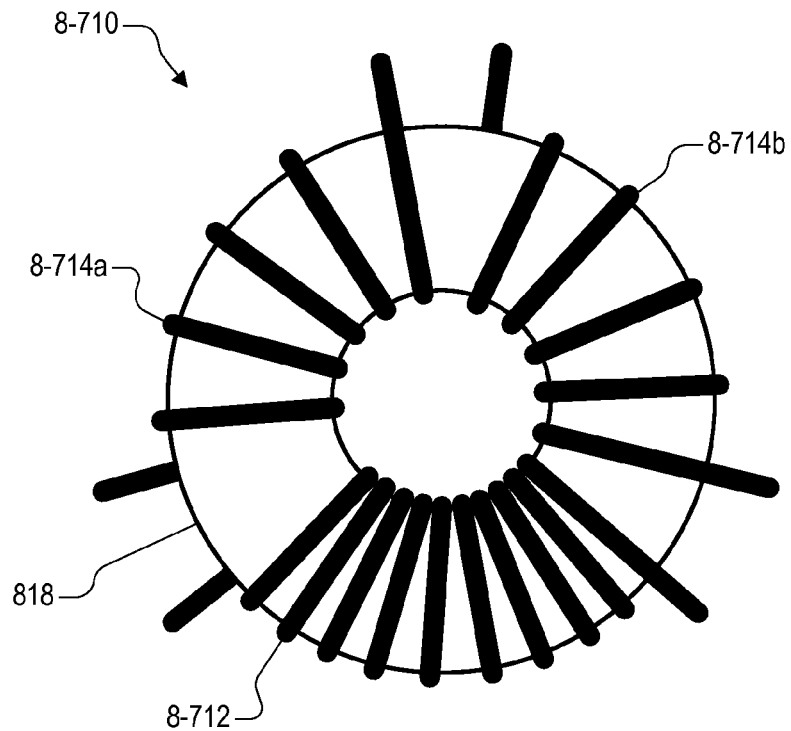
FIG. 8 is drawing of a multi-winding choke suitable for use in the filter circuit of FIG. 7 according to an embodiment.

FIG. 8 is drawing of a multi-winding choke 8-710 suitable for use as the choke 7-710 of the filter circuit 7-300 of FIG. 7, according to an embodiment. The multi-winding choke 8-710 includes three mutually coupled windings each wound around a core 818: a first winding 8-712 and second and third windings 8-714a and 8-714b. The core 818 includes a material having a high magnetic permeability.

The second winding 8-714a has the same number of turns as the third windings 8-714b, and the first winding 8-712 has twice as many turns as the second winding 8-714a or the third winding 8-714b. To minimize leakage inductance, the first winding 8-712 is wound tightly around the core 818 and with closely spaced turns.

The second and third windings 8-714a and 8-714b, on the other hand, are wound tightly around the core 818 but with turns that are spaced apart from each other. As a result, the second and third windings 8-714a and 8-714b each have a substantial leakage inductance. A person of skill in the art in light of the teachings and disclosures herein would understand how to determine the leakage inductance of the second and third windings 8-714a and 8-714b.

Figure 9:
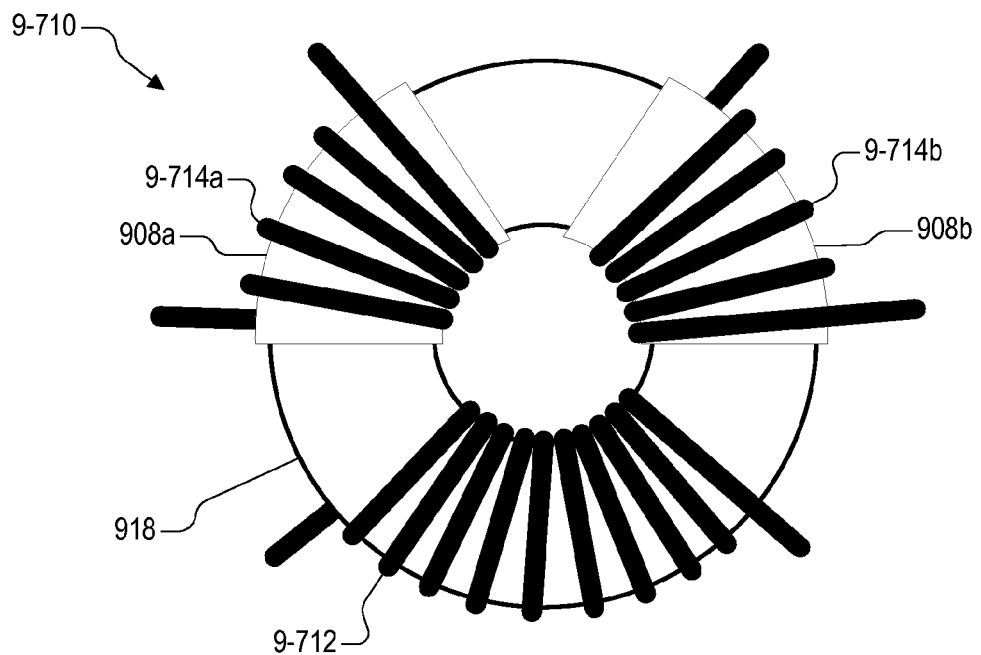
FIG. 9 is drawing of a multi-winding choke suitable for use in the filter circuit of FIG. 7 according to another embodiment.

FIG. 9 is drawing of a multi-winding choke 9-710 suitable for use as the choke 7-710 of the filter 7-300 of FIG. 7, according to another embodiment. The multi-winding choke 9-710 includes three mutually coupled windings, each wound around a core 918: a first winding 9-712 and second and third windings 9-714a and 9-714b. The core 918 includes a material having a high magnetic permeability.

The choke 9-710 further includes first and second sleeves 908a and 908b, each configured around a portion of the core 918. The first and second sleeves 908a and 908b include a material having a low magnetic permeability. In an embodiment, the first and second sleeves 908a and 908b may include one or more air gaps.

The second winding 9-714a has the same number of turns as the third windings 9-714b, and the first winding 9-712 has twice as many turns as the second winding 9-714a or the third winding 9-714b. To minimize leakage inductance, the first windings 9-712 is wound tightly around the core 918 and with closely spaced turns.

The second and third windings 9-714a and 9-714b, on the other hand, are wound around the first and second sleeves 908a and 908b, respectively, and the second and third windings 9-714a and 9-714b are thus wound a distance away from the core 918. Because the first and second sleeves 908a and 908b have a low magnetic permeability, the distance between the second and third windings 9-714a and 9-714b and the core 918 causes flux leakage. The flux leakage operates to produce a higher leakage inductance in each of the second and third windings 9-714a and 9-714b. As a result, the second and third windings 9-714a and 9-714b each have a substantial leakage inductance. A person of skill in the art in light of the teachings and disclosures herein would understand how to determine the leakage inductance of the second and third windings 9-714a and 9-714b.

FIG. 10A is a flowchart of a method 1000 of attenuating pseudo-differential currents, according to an embodiment. At S1010, the pseudo-differential currents are received through three or more conductors.

At S1020, a choke that is coupled to the conductors attenuates the pseudo-differential currents. In an embodiment, the choke includes at least three mutually coupled windings, including a first winding which has a number of turns that is equal to the sum of the number of turns of the other windings. In an embodiment, the first winding is coupled to a one of the conductors carrying a pseudo-differential return current.

FIG. 10B is a flowchart 1050 of a method of attenuating differential currents, according to an embodiment. At S1060, differential currents are received through first and second conductors. At S1070, attenuating the differential currents is performed using first and second inductances. In an embodiment, the first and second inductances are first and second leakage inductances of mutually coupled windings in a choke. In an embodiment, a capacitor is coupled to the first and second inductances. In this embodiment, the first and second inductances and the capacitor are configured to operate as a low pass filter that attenuates the differential currents.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. An apparatus, comprising:
    a plurality of conductors; and
    a choke configured to attenuate pseudo-differential currents flowing in the plurality of conductors, the choke having a plurality of mutually coupled windings,
    wherein the plurality of mutually coupled windings of the choke include a first winding and a plurality of second windings, and
    wherein a number of turns of the first winding is substantially equal to a total number of turns of the plurality of second windings.

2. The apparatus of claim 1, wherein the attenuated pseudo-differential currents include a high frequency pseudo-differential current having a frequency above 24 KHz.

3. The apparatus of claim 1, further comprising first and second inductors configured to attenuate high frequency differential currents flowing in respective first and second conductors of the plurality of conductors, and wherein the plurality of conductors includes at least three conductors.

4. The apparatus of claim 3, wherein the choke is a first choke, and the first and second inductors are respectively first and second mutually coupled windings of a second choke.

5. The apparatus of claim 3, further comprising a capacitor electrically coupled between a terminal of the first inductor and a terminal of the second inductor.

6. The apparatus of claim 1, wherein the choke is a first choke, further comprising a second choke configured to attenuate high frequency common mode currents flowing in the plurality of conductors.

7. The apparatus of claim 6, wherein the second choke comprises at least three windings each having a substantially same number of turns.

8. The apparatus of claim 1, further comprising:

a first capacitor electrically coupled between a terminal of the first winding of the choke and first terminal of the plurality of second windings of the choke; and a second capacitor electrically coupled between the first terminal of the plurality of second windings of the choke and a second terminal of the plurality of second windings of the choke, wherein the plurality of conductors includes at least three conductors.

9. The apparatus of claim 1, wherein the choke is configured to attenuate differential currents on first and second conductors of the plurality of conductors.

10. The apparatus of claim 9, wherein a first winding of the plurality of second windings of the choke is electrically coupled to the first conductor, a second winding of the plurality of second windings of the choke is electrically coupled to the second conductor, and the first and second windings of the plurality of second windings each have a substantial leakage inductance.

11. The apparatus of claim 10, further comprising a capacitor electrically coupled between a terminal of the first winding of the plurality of second windings and a terminal of the second winding of the plurality of second windings.

12. The apparatus of claim 10, wherein the leakage inductance of each of the first and second windings of the plurality of second windings is at least one microhenry.

13. The apparatus of claim 1, wherein the apparatus is electrically coupled between a Power Line Communication (PLC) modem and a pass-through socket.

14. An apparatus, comprising:
a plurality of conductors; and
a choke configured to attenuate pseudo-differential currents flowing in the plurality of conductors, the choke having a plurality of mutually coupled windings,
wherein the choke includes:
a core;
a first winding wound around the core; and
a plurality of second windings each wound around the core,
wherein the first winding and the plurality of second windings are mutually coupled, and a number of turns of the first winding is equal to a total number of turns of the plurality of second windings.

15. The apparatus of claim 14, wherein a leakage inductance of each of the plurality of second windings is substantially greater than a leakage inductance of the first winding.

16. A method comprising:
receiving pseudo-differential currents through a plurality of conductors; and
attenuating the pseudo-differential currents using a choke, the choke having a plurality of mutually coupled windings,
wherein the plurality of mutually coupled windings of the choke include a first winding and a plurality of second windings,
wherein a number of turns of the first winding is substantially equal to a total number of turns of the plurality of second windings.

17. The method of claim 16, wherein the choke is a first choke, further comprising:
receiving differential currents through first and second conductors of the plurality of conductors; and
attenuating the differential currents using first and second inductances,
wherein the first inductance is a first leakage inductance of a first winding of mutually coupled windings of a second choke, and
wherein the second inductance is a second leakage inductance of a second winding of the mutually coupled windings of the second choke.

18. The method of claim 16, further comprising attenuating the pseudo-differential currents using first and second capacitances coupled to the choke.

19. The method of claim 16, further comprising:
receiving differential currents through first and second conductors of the plurality of conductors; and
attenuating the differential currents using first and second inductances,
wherein the first inductance is a first leakage inductance of a first winding of the plurality of second windings, and
wherein the second inductance is a second leakage inductance of a second winding of the plurality of second windings.

* * * * *